United States Patent [19]

Rosen et al.

[11] Patent Number: 5,710,944
[45] Date of Patent: Jan. 20, 1998

[54] MEMORY SYSTEM AND DATA COMMUNICATIONS SYSTEM

[75] Inventors: Benjamin Rosen, Ganei Tikva; Avi Ginsberg, Petach-Tiquva; Itzhak Barak, Tel Aviv; Yaron Ben-Arie, Ramat-Gan, all of Israel

[73] Assignee: Motorola, Inc., Schaumburg, Ill.

[21] Appl. No.: 599,016

[22] Filed: Feb. 9, 1996

[51] Int. Cl.[6] .................................................. G06F 13/00
[52] U.S. Cl. ......................... 395/875; 364/239.7; 395/471
[58] Field of Search .............................. 395/200.08, 250, 395/445–480, 486, 872–877

[56] References Cited

U.S. PATENT DOCUMENTS

| | | | |
|---|---|---|---|
| 3,824,551 | 7/1974 | Arciprete et al. | 395/875 |
| 4,380,798 | 4/1993 | Shannon et al. | 395/724 |
| 4,638,422 | 1/1987 | Rees | 395/875 |
| 5,251,310 | 10/1993 | Smelser et al. | 395/471 |
| 5,329,624 | 7/1994 | Kawagishi et al. | 395/875 |
| 5,404,483 | 4/1995 | Stamm et al. | 395/471 |
| 5,471,602 | 11/1995 | DeLano | 395/445 |
| 5,510,934 | 4/1996 | Brennan et al. | 395/446 |
| 5,544,344 | 8/1996 | Frame | 395/471 |
| 5,553,265 | 9/1996 | Abato et al. | 395/470 |
| 5,586,294 | 12/1996 | Goodwin et al. | 395/464 |

Primary Examiner—Lance Leonard Barry, Esq.

[57] ABSTRACT

A memory system (3) for storing data messages communicated between a processor unit (13) and a communication module (11), each data message comprising at least one data word, comprises a memory array (4) having a plurality of memory buffers (B0–BM), each buffer for storing a data message, and logic circuitry (24) coupled to the memory array (4). The logic circuitry (24) sets one bit of a data message stored in a memory buffer to a first logic state during a processor unit read access when the processor unit (13) reads a current data message from the memory buffer, and negates the one bit to a second logic state during a communication module write access when the communication module (11) writes a new data message into the memory buffer. When the communication module (11) is to write a new data message to one of the memory buffers, the state of the one bit of the current data message stored in the one memory buffer provides an indication as to whether the new data message will overwrite the current data message, which current data message has not been read by the processor unit (13) or whether the new data message will overwrite the current data message, which current data message has been read by the processor unit (13).

11 Claims, 1 Drawing Sheet

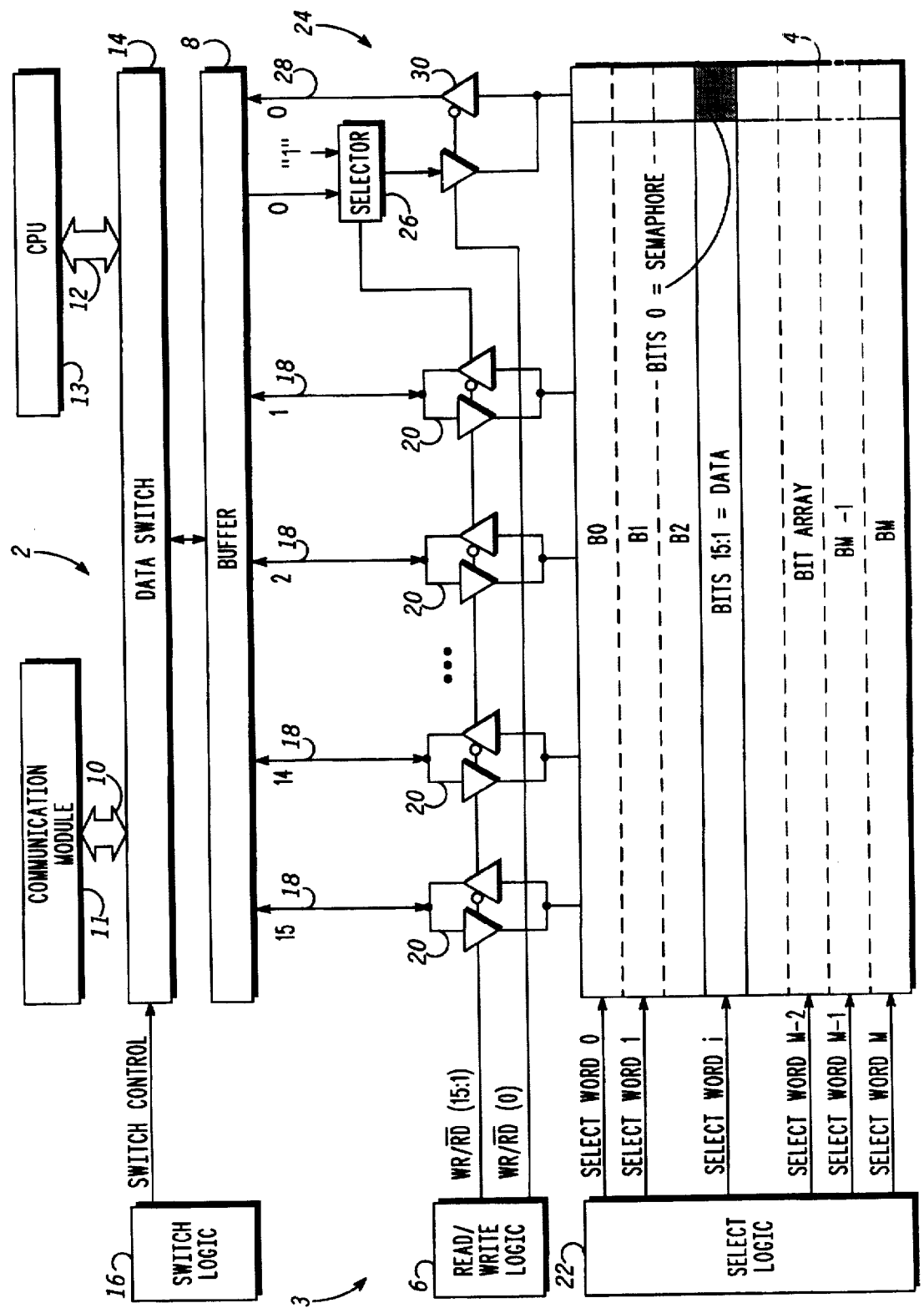

5,710,944

MEMORY SYSTEM AND DATA COMMUNICATIONS SYSTEM

FIELD OF THE INVENTION

This invention relates to a memory system for storing data messages communicated between a processor unit and a communication module and a data communications system incorporating such a memory system.

BACKGROUND OF THE INVENTION

Memory systems for storing data messages communicated between a processor unit and a communication module are typically used in data communication systems in automotive and industrial applications wherein the processor unit is a CPU and the communication module a serial communications device.

In known systems, the memory system receives data messages from the communication module which are destined for the processor unit and from the processor unit which are destined for the communication module and stores the messages in a memory array which comprises a plurality of memory buffers. The communication module or processor unit selects one of the memory buffers to store the data message from the processor unit or communication module, respectively. The memory array is thus shared between the processor unit and communication module.

In the case when the communication module has written a data message to a particular memory buffer and then writes a new data message to the particular memory buffer, it is useful to indicate to the processor unit whether the particular memory buffer is full or overrun. A full status indicates that the processor unit has already read the old message and that the new data message is a new message to be read. An overrun status indicates that the processor unit has not read the old message and that the new message has overwritten the old message, the data of which has been subsequently lost.

Some known arrangements implement a semaphore bit in the memory array for each memory buffer to indicate memory buffer full or overrun. However, in such known arrangements the semaphore bit must be updated using additional write accesses either by the processor unit or by the communication module. For accesses by the processor unit, the processor unit has to mark the semaphore bit of the particular memory buffer being accessed by an extra write. For accesses by the communication module, the communication module has to initiate a special memory access which requires additional hardware and adds to the complexity of the memory system. These additional write accesses to update the semaphore bit therefore results in a degradation to speed and hence performance.

Another solution, implements a semaphore bit in a register external to the memory array. Such a solution requires external logic to implement a semaphore bit per memory buffer comprising N semaphore flip-flops (where N is the number of memory buffers) with logic to decode/encode which memory buffer is currently selected and what is its semaphore bit status. Such a solution requires significant additional hardware and silicon area and adds to the complexity of the memory system.

There is therefore a need for an improved memory system which provides an indication of memory buffer overrun status or full status to the processor unit and which overcomes, or least reduces, the problems and disadvantages of the prior art systems.

SUMMARY OF THE INVENTION

In accordance with the present invention there is provided a memory system for storing data messages communicated between a processor unit and a communication module. Each data message comprises at least one data word. The memory system comprises a memory array having a plurality of memory buffers, each buffer for storing a data message, and logic circuitry coupled to the memory array. The logic circuitry sets one bit of a data message stored in a memory buffer to a first logic state during a processor unit read access when the processor unit reads the data message from the memory buffer, and negates the one bit to a second logic state during a communication module write access when the communication module writes a new data message into the memory buffer. When the communication module is to write a new data message to one of the memory buffers, the state of the one bit of the current data message stored in the one memory buffer provides an indication as to whether the new data message will overwrite the current data message, which current data message has not been read by the processor unit (memory buffer overrun) or whether the new data message will overwrite the current data message, which current data message has been read by the processor unit (memory buffer full).

Since the one bit of a data message stored in one of the memory buffers is set simultaneously as the data message is read from the memory buffer by the processor unit, no additional accesses are required in order to provide an indication that the processor unit has read the data message stored in the memory buffer.

Preferably, the one bit of the data message is the least significant bit (LSB) of the one data word.

Each data message may comprise at least two data words. In such an arrangement the logic circuitry sets and negates one bit of the first data word of the at least two data words. Preferably, the one bit is the least significant bit (LSB) of the first data word.

A data communications system incorporating the memory system in accordance with the invention is also disclosed and claimed in the accompanying claims.

BRIEF DESCRIPTION OF THE DRAWING

A memory system and a data communications in accordance with the present invention will now be more fully described, by way of example only, with reference to the sole FIGURE which shows a schematic block diagram of a data communications system incorporating a memory system in accordance with the present invention.

DETAILED DESCRIPTION OF THE DRAWING

Referring to the sole FIGURE, a data communications system 2 in accordance with a preferred embodiment of the present invention includes a memory system 3 comprising a memory array 4 having a plurality of M memory buffers B0–BM for storing data messages communicated between a processor unit 13, such as a CPU and a communication module 11, such as a serial communications device. Data messages are communicated to and from the communication module 11 via data bus 10 and to and from the CPU 13 via data bus 12 under the control of data switch 14 and switch logic 16. A buffer 8 buffers the data messages between the data switch 14 and the memory array 4.

The sole FIGURE shows each memory buffer B0–BM having a storage capacity of one data word of 16 bits (15:0). This is for illustration purposes only. Each memory buffer may have the capacity to store messages comprising two or more data words of 8, 16 or even 32 bits.

In the preferred embodiment, the memory array 4 is implemented as a dual port Random Access Memory (RAM); that is, a physical single port RAM shared by the CPU 13 and the communication module 11. The invention is not, however, limited to RAM and may be implemented in other types of solid state memory.

The bits (15:1) of each data word stored in the memory buffers B0–BM are accessed by communication module 11 or by CPU 13 via bit lines 18 under the control of access logic 6 (or read/write logic). The read/write logic 6 provides first wr/rd[15:1] and second wr/rd[0] access control signals (or read/write control signals). The first access control signal wr/rd[15:1] is provided to logic gates 20 which are coupled to each bit line 18. In response to the first access control signal wr/rd[15:1], the logic gates 20 determine whether data is to be written into one of the memory buffers B0–BM or read from one of the memory buffers. Select logic 22 selects which one of the memory buffers is to be accessed during a read or write cycle.

The least significant bit (LSB) (bit[0]) of each memory buffer is coupled to the buffer 8 via logic circuitry 24. Logic circuitry 24 comprises a multiplexer 26 having two inputs: a first input is coupled to receive from the buffer 8 the LSB of the data message which is to be written to a memory buffer and the second input is coupled to receive a signal having a first logic state, which in the preferred embodiment is a logic "1". The output of the multiplexer is coupled to the LSB of the memory buffers B0–BM via a logic gate 30. The LSB bit of the data message stored in each memory buffer is read from the memory buffers via a bit line 28 which is coupled to the LSB of the memory buffers B0–BM via the logic gate 30. The second access control signal wr/rd[0] from the read/write logic 6 is coupled to the logic gate 30 and determines whether data is to be written to or read from the LSB bit of the memory buffers. The second access control signal wr/rd[0] from the read/write logic 6 also controls the multiplexer 26 to select which of the first and second inputs is coupled to the LSB of the memory buffers B0–BM.

The operation of the memory system 3 in accordance with a preferred embodiment of the invention will now be described with reference to FIG. 1 and also to Tables 1 and 2, given below. Table 1 summarises the behaviour of the access control signals during read and write accesses of the CPU 13 and Table 2 summarises the behaviour of the access signals during read and write accesses of the communication module 11.

TABLE 1

| Source of Access | Access Type | wr/rd [15:1] | wr/rd [0] | Bits 15 14 13 ... 4 3 2 1 | Bit 0 |
|---|---|---|---|---|---|
| CPU | Read | 0 | 1 | ← Rd → | Wr |
| CPU | Write | 1 | 1 | ← Wr → | Wr |

TABLE 2

| Source of Access | Access Type | wr/rd [15:1] | wr/rd [0] | Bits 15 14 13 ... 4 3 2 1 | Bit 0 |
|---|---|---|---|---|---|
| Module | Read | 0 | 0 | ← Rd → | Rd |
| Module | Write | 1 | 1 | ← Wr → | Wr |

When the CPU 13 initiates a read access of the contents of one of the memory buffers, say memory buffer B2, select logic 22 selects memory buffer B2, read/write logic 6 generates first access control signal wr/rd[15:1] having a second logic state, which in the preferred embodiment is a logic "0", and second access control signal wr/rd[0] having the first logic state, a logic "1". In response to the first access control signal wr/rd[15:1], the logic gates 20 transfer bits [15:1] of the data message from the memory buffer B2 to the buffer 8 via the bit lines 18 and the multiplexer 26 selects the signal at its second input. In response to receiving the second access control signal wr/rd[0] having a logic "1", the logic gate 30 transfers the signal having the logic "1" state, at the second input of the multiplexer 26, to the memory array such that the LSB [0] of the data message stored in the memory buffer B2 is set to a logic "1". The LSB [0] of the data message read from the memory buffer B2 is therefore lost. The data message is then transferred from buffer 8 to the CPU 13 via bus 12.

Thus, the reading of the data message stored in memory buffer B2 and the writing to the LSB of the data message stored in memory buffer B2 occurs simultaneously.

During normal flow, when a communication module 11 initiates a write access to write a new data message into memory buffer B2, the communication module 11 first reads the current data message in the memory buffer B2 and checks the LSB of the current data message. If the LSB is a logic "1", the CPU 13 has read the current data message so that the communication module 11 can indicate to the CPU 13, once the new message has been written into memory buffer B2, that the new message is new and that the memory buffer B2 is full. If the LSB is a logic "0", the CPU 13 has not read the current message so that the communication module 11 can indicate to the CPU 13, once the new message has been written into the memory buffer B2, that the new message has overwritten a current message which has therefore been lost.

In a preferred embodiment, the communication module 11 reads the state of the LSB of the message stored in a memory buffer and then updates a status indicator, which indicates overrun or full, for the memory buffer in a status field in a register (not shown). The CPU 13 reads the status field for a memory buffer in the register (not shown) in order to determine whether the memory buffer is full or overrun.

For a communication module 11 or a processor unit write access, a data message from the communication module 11 or the processor unit, respectively, is received by the buffer 8. The read/write logic 6 provides the first wr/rd[15:1] and second wr/rd[0] access control signals with the first logic state, logic "1", to the logic gate 20 and the multiplexer 26, and the logic gate 30 respectively such that the first input of the multiplexer 26 is selected and the data message, including the LSB, is written from the buffer 8 into a selected one of the memory buffers. A memory buffer is selected according to the select logic 22.

When the communication module 11 writes a new data message into a selected one of the memory buffers B0–BM, the LSB of the data message stored in the selected memory buffer is negated to logic "0". The communication module 11 puts a signal having the second logic state, logic "0", on the LSB line of the data bus 10 whenever it writes to a memory buffer.

When the communication module 11 initiates a read access of the contents of one of the memory buffers B0–BM, select logic 22 selects one of the memory buffers, read/write logic 6 generates first wr/$\overline{rd}$[15:1] and second wr/$\overline{rd}$[0] access control signals having the second logic state, a logic "0". In response to the first wr/$\overline{rd}$[15:1] and second wr/$\overline{rd}$[0] access control signals, the logic gates 20 and the logic gate 30 transfer respective bits [15:1] and the LSB bit [0] of the data message from the selected memory buffer to the buffer 8 via the bit lines 18 and 28, respectively.

In data communications systems wherein the data messages comprises at least two data words, the memory system in accordance with the invention is implemented such that during a processor unit read access to a selected one of the memory buffers, the LSB (bit [0]) of the first data word of the data message stored in the selected memory buffer is set to the first logic state, logic "1" simultaneously as the bits [15:1] of the first data word are read from the selected memory buffer as described above. The second and any subsequent data words are transferred from the selected memory buffer as normal. During a communication module write access, the LSB of the first data word is negated to the second logic state, logic "0", as described above. That is, only the LSB of the first data word is used to provide an indication of overrun status or full status.

The invention has so far been described in relation to setting a LSB of a data message stored in a memory buffer in response to a processor unit read access to the data message. It will, however, be appreciated that the invention may also be implemented for a communication module read access, if desired. That is, the LSB of the data message stored in a memory buffer is set to a logic "1" simultaneously as the communication module reads the data message from the memory buffer.

In summary, by setting the LSB of the data message stored in one of the memory buffers simultaneously as the data message is read from the memory buffer, the present invention provides a memory system which can provide an indication of the fact that the processor unit has read a data message from the memory system (that is, overrun status or full status) without the need to execute extra accesses to the memory system. Moreover, the present invention is implemented in the memory system and thus, does not require additional complex external logic as does the prior art.

Thus, the present invention executes internal data transfers between the memory system and the CPU or communication module for internal actions and exploits one of these transfers to update the LSB of a word of a stored data message.

It will be appreciated that although only a particular embodiment of the invention has been described in detail, various modifications and improvements can be made by a person skilled in the art without departing from the scope of the present invention.

We claim:

1. A memory system for storing data messages communicated between a processor unit and a communication module, each data message comprising at least one data word, the memory system comprising:

a memory array having a plurality of memory buffers, each buffer for storing a data message;

logic circuitry coupled to the memory array for setting one bit of a data message stored in one of the memory buffers to a first logic state during a processor unit read access when the processor unit reads the data message from the one of the memory buffers, and for negating the one bit to a second logic state during a communication module write access when the communication module writes a new data message into the one of the memory buffers, wherein when the communication module is to write a new data message to one of the memory buffers, the state of the one bit of the current data message stored in the one memory buffer provides an indication as to whether the new data message will overwrite the current data message, which current data message has not been read by the processor unit or whether the new data message will overwrite the current data message, which current data message has been read by the processor unit.

2. A memory system according to claim 1 wherein each data message comprises one data word and wherein the one bit of the data message is the least significant bit (LSB) of the one data word.

3. A memory system according to claim 1 wherein each data message comprises at least two data words and the logic circuitry sets and negates one bit of the first data word of the at least two data words.

4. A memory system according to claim 3 wherein the one bit is the least significant bit (LSB) of the first data word.

5. A memory system according to claim 1 wherein the logic circuitry comprises:

access logic for providing first and second access control signals, the first and second access control signals each having a first logic state or a second logic state;

a multiplexer having a first input for receiving the one bit of a data message transmitted by the processor unit or the communication module for storage in the memory array, a second input for receiving a signal having the first logic state, a control input for receiving the first access control signal and an output; and a logic gate coupled to the output of the multiplexer and to receive the second access control signal, and to the memory array such that the output of the multiplexer can be transferred to the one bit of one of the memory buffers during a write access and the one bit of a data message can be transferred from one of the memory buffers during a read access, wherein during a processor unit read access, the access logic provides the first access control signal having the second logic state to the multiplexer and the second access control signal having the first logic state to the logic gate such that the signal at the second input of the multiplexer is transferred by the logic gate to the one bit of one of the memory buffers whereby the one bit of the data message stored in the one memory buffer is set to the first logic state, wherein during a communication module or a processor unit write access the access logic provides the first and second access control signals, each having the first logic state, to the multiplexer and the logic gate respectively, such that the one bit of a data message at the first input of the multiplexer is transferred by the logic gate to the one bit of one of the memory buffers, and wherein during a communication module read access the access logic provides the first and second access control signal, each having the second logic state, to the multiplexer and the logic gate respectively, such that the one bit of a data message stored in one of the memory buffers is transferred by the logic gate to the communication module.

6. A data communications system comprising:

a processor unit for transmitting and receiving data messages;

a communication module for transmitting and receiving data messages; and a memory system for storing data messages received from the communication module for subsequent transmission to the processor unit and for storing data messages received from the processor unit for subsequent transmission to the communication module, each data message comprising at least one data word, the memory system comprising:

a memory array having a plurality of memory buffers, each buffer for storing a data message;

logic circuitry coupled to the memory array for setting one bit of a data message stored in one of the memory buffers to a first logic state during a processor unit read access when the processor unit reads the data message from the one of the memory buffers, and for negating the one bit to a second logic state during a communication module write access when the communication module writes a new data message into the one of the memory buffers, wherein when the communication module is to write a new data message to one of the memory buffers, the state of the one bit of the current data message stored in the one memory buffer provides an indication as to whether the new data message will overwrite the current data message, which current data message has not been read by the processor unit or whether the new data message will overwrite the current data message, which current data message has been read by the processor unit.

7. A data communications system according to claim 6 wherein each data message comprises one data word and wherein the one bit of the data message is the least significant bit (LSB) of the one data word.

8. A data communications system according to claim 6 wherein each data message comprises at least two data words and the logic circuitry sets and negates one bit of the first data word of the at least two data words.

9. A data communications system according to claim 8 wherein the one bit is the least significant bit (LSB) of the first data word.

10. A data communications system according to claim 6 wherein the logic circuitry comprises:

access logic for providing first and second access control signals, the first and second access control signals each having a first logic state or a second logic state;

a multiplexer having a first input for receiving the one bit of a data message transmitted by the processor unit or the communication module for storage in the memory array, a second input for receiving a signal having the first logic state, a control input for receiving the first access control signal and an output; and a logic gate coupled to the output of the multiplexer and to receive the second access control signal, and to the memory array such that the output of the multiplexer can be transferred to the one bit of one of the memory buffers during a write access and the one bit of a data message can be transferred from one of the memory buffers during a read access, wherein during a processor unit read access, the access logic provides the first access control signal having the second logic state to the multiplexer and the second access control signal having the first logic state to the logic gate such that the signal at the second input of the multiplexer is transferred by the logic gate to the one bit of one of the memory buffers whereby the one bit of the data message stored in the one memory buffer is set to the first logic state, wherein during a communication module or a processor unit write access the access logic provides the first and second access control signals, each having the first logic state, to the multiplexer and the logic gate respectively, such that the one bit of a data message at the first input of the multiplexer is transferred by the logic gate to the one bit of one of the memory buffers, and wherein during a communication module read access the access logic provides the first and second access control signal, each having the second logic state, to the multiplexer and the logic gate respectively, such that the one bit of a data message stored in one of the memory buffers is transferred by the logic gate to the communication module.

11. A data communications system according to claim 6 further comprising a register having a status field for each memory buffer, the status field for a memory buffer being updated by the communication module when the communication module writes a new message to the memory buffer according to the logic state of the one bit of the data message currently stored in the memory buffer, each status field indicating an overrun status when a new data message from the communication module overwrites a current data message which current data message has not been read by the processor unit and an underrun status when a new data message from the communication module overwrites a current data message which current data message has been read by the processor unit.

* * * * *